United States Patent [19]

Boutigny

[11] Patent Number: 4,729,113
[45] Date of Patent: Mar. 1, 1988

[54] METHOD AND ARRANGEMENT FOR RECOVERING AN ANALOGUE SIGNAL

[75] Inventor: Pierre-Henri Boutigny, Epinay Sous Senart, France

[73] Assignee: U.S. Philips Corporation, New York, N.Y.

[21] Appl. No.: 6,322

[22] Filed: Jan. 14, 1987

Related U.S. Application Data

[63] Continuation of Ser. No. 630,173, Jul. 12, 1984, abandoned.

[30] Foreign Application Priority Data

Oct. 3, 1983 [FR] France .................. 83 15701

[51] Int. Cl.⁴ .............................................. G06G 7/00
[52] U.S. Cl. ..................................... 364/807; 364/808
[58] Field of Search ............... 364/807, 808, 800, 600, 364/601, 602; 340/347 M, 347 NT

[56] References Cited

U.S. PATENT DOCUMENTS

| | | | |
|---|---|---|---|
| 3,996,456 | 12/1976 | Hoover | 364/807 |
| 4,143,365 | 3/1979 | Cayzac | 340/347 NT |
| 4,228,423 | 10/1980 | Schwerdt | 340/347 M |
| 4,308,524 | 12/1981 | Harrison | 340/347 M |

*Primary Examiner*—E. A. Goldberg
*Assistant Examiner*—Mark Reinhart
*Attorney, Agent, or Firm*—Bernard Franzblau

[57] ABSTRACT

A method and an arrangement for recovering an analog signal E(t) and for displaying and/or processing it, for example, on an oscilloscope as a useful recovered signal X(t), in the envelope display mode and/or in the signal display mode. In the method, the average values of the k results are determined which are obtained after multiplication of the analog signal E(t) by the function $\vec{f}_k(t)$ chosen as a function of the passband of the analog signal E(t). These average values can also be obtained by means of a filter having a pulse response $\vec{h}_k(t)$, where $\vec{h}_k(t) = \vec{f}_k(\tau - t)$. The filter has at its k outputs transmittances $h_k(t)$. These average values permit of calculating k coefficients $\vec{S}_k$, which serve to determine the calculated recovered signal S(t). The latter is then compared with the analog signal E(t), while on the basis of an error criterion, which may be the average quadratic error, the signal mode or envelope mode of the useful recovered signal X(t) is chosen, which choice may be automatic. The maximum (SUP) and minimum (INF) values of the analog signal E(t) are also determined. Special choices of functions $\vec{f}_k(t)$ of the type $f_n(t) = n \cdot (1-t)^{n-1}$ permit of obtaining a simple experimental realization of the arrangement according to the invention used in an oscilloscope.

27 Claims, 6 Drawing Figures

METHOD AND ARRANGEMENT FOR RECOVERING AN ANALOGUE SIGNAL

This is a continuation of application Ser. No. 630,173, filed July 12, 1984, now abandoned.

This invention relates to a method of recovering an analog signal E(t) in the form of a useful recovered signal X(t) intended to be displayed and/or processed and formed per analysis period τ, either from the samples of the calculated recovered signal S(t) represented in the signal display mode or from the minimum and maximum values of the analog signal E(t) represented in the envelope display mode. It relates clearly to any arrangement for carrying out this method and to any oscilloscope in which such an arrangement is utilized.

It is known from the prior art that in the field of digital oscilloscopy difficulties are met in displaying correctly the digital signals derived from the usual analog signals. In fact, according to the relation between the frequency of the analogue signals to be analysed and that of the sampling signal, erroneous representations are obtained, which can cause the display presented on the screen to become meaningless. A proposal to solve this difficulty consists in that over a sampling period designated as analysis period τ, the maximum and minimum values assumed by the analog signal are determined, which method is designated as MIMAC. This is described in French Pat. No. 2 337 343 of the applicant filed on Dec. 31, 1975 now U.S. Pat. No. 4,143,365. Thus, per analysis period τ, the minimum and the maximum of the analog signal, that is to say the envelope of the analog signal, are displayed, this mode being designated hereinafter as the envelope mode.

On the other hand, the digital values obtained in each analysis period τ can also be displayed successively. This mode of displaying the signal is designated hereinafter as the signal mode.

In this second case, in order to eliminate certain ambiguities in the interpretation of the representation, especially due to the fact that the eye tends more readily to associate two luminous points to be close to each other rather in space than in time, methods and arrangements have been proposed in the article entitled: "De l'oscilloscope conventionel à l'oscilloscope à mémoire numérique" by R. BRUN, published in the magazine "Acta Electronica", Vol. 24, Nr. 4, 1981/1982, pages 301 to 308, in which linear interpolation methods and filtering methods for obtaining an improved display have been described. Thus, an arrangement has been proposed which permits of carrying out a linear interpolation between the consecutive points, that is to say of connecting two consecutive points by a segment of a straight line. Thus, an auxiliary means for interpretation has been obtained which makes it possible to estimate more exactly the variation of the reconstructed signal.

However, in the case of rapid signals, for which the maximum frequencies and their frequency spectrum approach the so-called Shannon frequency, i.e. half the sampling frequency Fe, it becomes impossible to interpret the displayed representations.

Digital filtering methods are also utilized to ensure a more exact representation of the reconstructed signals, as described in the aforementioned publication.

However, in all of the cases mentioned, the Shannon frequency is a limit which must not be exceeded or even approached in the real situations to obtain correct results.

The known arrangements also offer the possibility to the user to make a manual, but global choice between the signal mode and the envelope mode, in which event the user has to make sure periodically that this choice is the optimum representation offered without the possibility of reconsidering his choice per unitary analysis period. It is not possible in these arrangements to know the error made in the proposed representation.

A first advantage of the invention is that the choice of the representation of the useful recovered signal X(t) in the signal mode or in the envelope mode is made automatically by the arrangement itself without the intervention of the user, while simultaneously the error obtained during the choice made is displayed.

A second advantage of the invention is the possibility of influencing the pass band of the useful recovered signal by adapting the choice of the recovery functions to the signals to be processed.

A third advantage of the invention is that the very rapid input circuits are small in number and the subsequent digital processing permits of eliminating a considerable number of conventional control circuits of an oscilloscope, which can become considerably slower, thus also reducing the material cost.

Hereinafter, the symbol $<A>$ means that the average value of A determined over a period defined below is concerned. Further, the symbol $\vec{S}_k$ or $\vec{f}_k(t)$ means that vectors of k dimensions ($S_n$ or $f_n$ being the $n^{th}$ component) are concerned.

The method and arrangement for recovering an analog signal according to the invention thus have the characteristic feature that approximation is based on the least squares principle.

For this purpose, the invention relates to a method and an arrangement for recovering an analog signal E(t) such as indicated in the preamble, in which the method of recovering an analog signal E(t) in the form of a useful recovered signal X(t) intended to be sequentially displayed and/or processed and formed per analysis period τ either from the samples of a calculated recovered signal S(t) represented in the signal display mode or from the minimum and maximum values of the analog signal E(t) represented in the envelope display mode characterized in that:

a choice is made from k functions $\vec{f}_k(t)$ so that the pass band covered by them permits of adapting the pass band of the calculated recovered signal S(t) to that of the analog signal E(t);

the analog signal E(t) is separately multiplied by the k functions $\vec{f}_k(t)$ chosen obtaining k products $E(t)·\vec{f}_k(t)$, of which the respective average values are calculated in order to obtain k average values $<E(t)·\vec{f}_k(t)>$ at the end of each analysis period τ;

the k coefficients $\vec{S}_k$ defined by $\vec{S}_k = M^{-1} · <E(t)·\vec{f}_k(t)>$ are determined, where $M^{-1}$ is the inverse value of the matrix M, which, when the choice from the k functions $\vec{f}_k(t)$ has been made, can be mathematically determined by minimizing with respect to the coefficients $\vec{S}_k$ the average quadratic error between the analog signal E(t) and the calculated recovered signal S(t);

the calculated recovered signal S(t) is determined by: $S(t) = \vec{S}_k · \vec{f}_k(t)$;

one or several error functions between the calculated recovered signal S(t) and the analog signal E(t) are determined;

in order to represent the signal in the envelope mode and/or in the signal mode, a choice, which may be automatic, is made in accordance with one or several limit values chosen for the said error functions, the latter being utilized alone or in combination;

the display and/or the subsequent processing of the useful recovered signal X(t) and/or of the said error functions are effected.

The invention will be described more fully with reference to a few embodiments and the accompanying drawings, in which.

Figure 1:
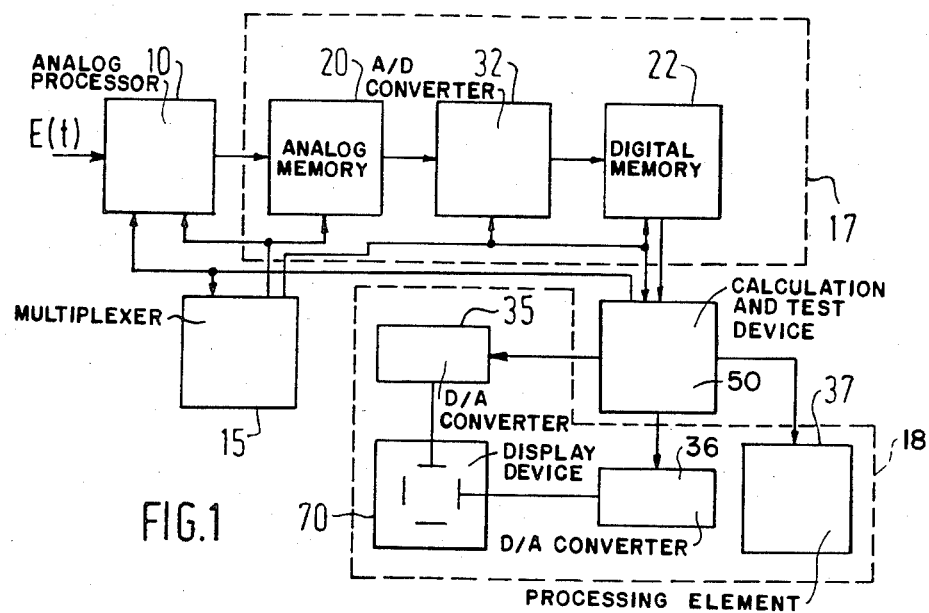
FIG. 1 shows a general block diagram of the arrangement for recovering the signal.

The analog signal E(t) is processed over a data-acquiring period T1 followed by a period T2 for processing the said data, the period T2 being generally longer than the period T1. The acquisition period T1 is decomposed into a given number of analysis periods $\tau$, for each of which the method described below is effected. At the end of the period T1, a given number of data is stored in a memory and is then processed during the period processing T2, at the end of which an assembly of calculated results is available to be displayed and/or processed, while the same processes of acquisition and subsequent processing are repeated.

The method according to the invention consists in that the calculated recovered signal S(t) is represented in the form of a sum of products of k coefficients $\vec{S}_k$ and k time functions $\vec{f}_k(t)$:

$$S(t) = \vec{S}_k \vec{f}_k(t). \tag{1}$$

The choice from the k functions $\vec{f}_k(t)$ is not arbitrary. In fact, the analog signal E(t), which is recovered by S(t), can be decomposed into a spectrum of frequencies from low frequencies to very high frequencies. It appears to be clear that, in order to recover the analog signal E(t), the functions $f_k(t)$ chosen have to permit of recovering to the optimum and simultaneously all these details of the frequency spectrum of the analog signal E(t). Dependent upon the envisaged application, at the beginning or by limited successive tests, those skilled in the art will therefore define the number and the type of functions $\vec{f}_k(t)$ which are most suitable in order that the pass band of the calculated recovered signal S(t) is adapted to the optimum to the analogue signal E(t).

The choice from the functions $\vec{f}_k(t)$ is determined by the fact that a linear combination thereof must be able to approximate the part of the signal E(t) lying in the time interval $\tau$. The choice and the number k of functions $f_k(t)$ therefore depend upon the signal E(t). A known method of approximation of a function E(t) is the limited development of E(t) into polynomials in t of increasing values. A linear combination of $(\alpha+2)$ polynomials having values from 0 to $(\alpha+1)$ can approximate every sinusoidal portion until $\alpha$ has become semi-sinusoidal in the approximation interval.

Thus, with $\alpha=2$, $k=\alpha+2=4$ polynomials having values between 0 and 3 are obtained and it is possible to approximate two semi-sinusoids, that is to say one complete sinusoid.

With $\alpha=5$, there are obtained $k=\alpha+2=7$ polynomials having values between 0 and 6 and it is possible to approximate six semi-sinusoids, that is to say three complete sinusoidal periods.

Thus, a choice from functions $\vec{f}_k(t)$ can be such a sequence of polynomials.

If the signal E(t) has a spectrum extending from 0 to $\alpha$ times the Shannon frequency, that is to say till $\alpha$ semi-sinusoids per time interval $\tau$, in conjunction with the foregoing, there can be chosen $k=(\alpha+2)$, the functions $\vec{f}_k(t)$ being represented by polynomials of increasing values from 0 to $\alpha+1$.

This choice having been made, the coefficients $\vec{S}_k$ have to be determined which permit of calculating the calculated recovered signal S(t). Therefore, the criterion chosen is to minimize the value of the average quadratic error between the calculated recovered signal S(t) and the analog signal E(t), i.e.:

$$<r^2> = <(E(t)-S(t))^2>, \tag{2}$$

which is written as:

$$<r^2> = <E^2(t)> + <S^2(t)> - 2\vec{S}_k \cdot <E(t) \cdot \vec{f}_k(t)> \tag{3}$$

By applying the criterion chosen above, coefficients $S_k$ are calculated which minimize this error, that is to say such as:

$$\frac{\partial <r^2>}{\partial \vec{S}_k} = 0 \tag{4}$$

Thus, a relation between the coefficients $\vec{S}_k$, the functions $\vec{f}_k(t)$ and the analog signal E(t) is obtained which is:

$$\vec{S}_k = M^{-1} \cdot <E(t) \cdot \vec{f}_k(t)> \tag{5}$$

where $M^{-1}$ is the inverse value of a matrix M obtained by this minimizing operation by:

$$M = \begin{vmatrix} <f_0 \cdot f_0> & \ldots & <f_n \cdot f_0> \\ \vdots & & \vdots \\ <f_0 \cdot f_n> & \ldots & <f_n \cdot f_n> \end{vmatrix} \tag{6}$$

where $f_o$ has been written for $f_0(t)$ and $f_n$ for $f_n(t)$.

The criterion for minimization of the value of the average quadratic error defines the type of the matrix M, which is totally defined by the choices of the functions $\vec{f}_k(t)$.

The method requires the acquisition of the terms of the average values $>E(t) \cdot \vec{f}_k(t)>$.

A first variation, which permits of carrying out this acquisition consists in that the k multiplications of the analog signal E(t) by the k functions $\vec{f}_k(t)$ are effected and the k average values $<E(t) \cdot \vec{f}_k(t)>$ for each analysis period $\tau$ are calculated. Thus, the coefficients $\vec{S}_k$ are obtained by the equation (5). The calculated recovered signal S(t) is obtained by carrying out the multiplication of the k functions $\vec{f}_k(t)$ by the k coefficients $\vec{S}_k$ in accordance with the relation (1).

A second variation, which has an increased resolution and a simplified construction and which permits of carrying out the acquisition of the terms $<E(t) \cdot \vec{f}_k(t)>$ consists in that functions $\vec{h}_k(t)$ are introduced, such as:

$$\vec{h}_k(t) = \vec{f}_k(\tau - t). \tag{7}$$

The k average values are then written as:

$$<E(t)\cdot \vec{f}_k(t)> = <E(t)\cdot \vec{h}_k(\tau-t)>.$$

Now the term $<E(t)\cdot \vec{h}_k(\tau-t)>$ represents the convolution product over the period $\tau$ of $E(t)$ and the functions $\vec{h}_k(t)$, i.e. the output of a filter receiving at the input the signal $E(t)$ and having a pulse response characterized by the functions $\vec{h}_k(t)$. It is deduced therefrom that the required k terms $<E(t)\cdot \vec{f}_k(t)>$ are the values obtained at the end of the analysis period $\tau$ at the k outputs of the filter characterized above. This has the condition of resetting these k outputs to zero at the beginning of each analysis period $\tau$, which results in that for these k outputs voltage levels are defined which correspond to an input signal $E(t)$ zero. This condition can be designated as the rest condition of the filter.

The functions $\vec{f}_k(t)$ having been chosen, the equation (7) permits of defining the filter to be utilized.

A special possibility of this is second variation can be obtained, for which it is not necessary to carry out the preceding operations of resetting to zero. This is the case when the functions $\vec{h}_k(t)$ obtained above can be written by using a constant matrix C as:

$$\vec{h}_k(\tau+x) = C\cdot \vec{h}_k(x) \qquad (8)$$

(x: an arbitrary variable).

In fact, the analysis period lying between two consecutive analysis periods $N\tau$ and $(N+1)\tau$ will now be considered. At the outputs of the pulse response filter $\vec{h}_k(t)$ at the instant $N\tau$ the signals $\vec{X}_N$ are obtained, such as:

$$\vec{X}_N = \int_0^{N\tau} E(t)\cdot \vec{h}_k(N\tau - t)dt.$$

Further, at the consecutive following instant there is obtained:

$$\vec{X}_{N+1} = \int_0^{(N+1)\tau} E(t)\cdot \vec{h}_k((N+1)\tau - t)dt.$$

By utilizing the relation (8), there can be written:

$$\vec{X}_{N+1} = C\cdot \int_0^{N\tau} E(t)\cdot \vec{h}_k(N\tau - t) + \int_{N\tau}^{(N+1)\tau} E(t)\cdot \vec{h}_k((N+1)\tau - t)dt$$

which can be written as:

$$\vec{X}_{N+1} = C\cdot \vec{X}_N + \int_0^{\tau} E(N\tau + t)\cdot \vec{h}_k(\tau - t)dt$$

which more generally is:

$$X_{N+1} = C\cdot X_N + <E(t)\cdot f_k(t)>. \qquad (9)$$

The latter relation therefore shows that the required terms $<E(t)\cdot \vec{f}_k(t)>$ can be obtained by means of the signal values $\vec{X}_N$ and $\vec{X}_{N+1}$ obtained at the outputs of the pulse response filter $n_k(t)$ without it being necessary to reset the outputs of the said filter to zero if the relation (8) is taken into account.

As in the foregoing, the equation (5) permits of determining the coefficients $\bar{S}_k$. The calculated recovered signal $S(t)$ is obtained by carrying out the multiplication of the k functions $\vec{f}_k(t)$ by the k coefficients $\bar{S}_K$ according to the relation (1).

This calculated recovered signal $S(t)$ has then to be compared with the analog signal $E(t)$ in order to decide about its use on the basis of a criterion for the choice of representation. Thus, error functions are defined characterizing the distance between the calculated recovered signal $S(t)$ and the analog signal $E(t)$. In accordance with one or several limit values chosen for each error functional and according as these error functions are smaller than, larger than or lie between the said limit values during a period of a given duration, the criterion for the choice of representation is defined, which imposes the desired mode of display. These error functions can be utilized alone or in combination.

For this purpose, the error function can be constituted by the values of the average quadratic error $<r^2>$, such as:

$$<r^2> = <(E(t)-S(t))^2>.$$

According to the relation (3), the average quadratic value of the analog signal $<E^2(t)>$, that of the calculated recovered signal $<S^2(t)>$ and the term $2\cdot \bar{S}_k\cdot <E(t)\cdot \vec{f}_k(t)>$ have to be calculated, where all terms are then determined. It is clear that, if the danalog signal $E(t)$ has slightly varied during the analysis period $\tau$, the value of $<r^2>$ will be small. On the contrary, it will be high if the signal has varied considerably during the said analysis period $\tau$.

Also, for this purpose, the error function can be that obtained when for each analysis period $\tau$ the maximum and minimum values of the calculated recovered signal $S(t)$ are compared with the maximum and minimum values of a series constituted by the maximum (SUP) and minimum (INF) values of the analog signal $E(t)$. Thus, when SUP $(S(t))$ and INF $(S(t))$ are designated as the maximum and the minimum, respectively, of $S(t)$ during an analysis period $\tau$, the error function is constituted by the couple of values $(A,B)$, such as:

$$A = |SUP - SUP(S(t))|$$

$$B = |INF - INF(S(t))|.$$

The error function $(A,B)$ can then be compared with a couple of limit values $(B_1,B_2)$, i.e. $|$limit value 1 and limit value 2$|$.

Clearly, another choice of error functions can be made for comparing the calculated recovered signal $S(t)$ and the analog signal $E(t)$ without leaving the scope of the invention.

By way of non-limitative example, the choice can be made to utilize in combination the error function constituted by the said average quadratic error $<r^2>$ and the said error function $(A,B)$. Thus, when at the end of the proceding stages of the method there is verified that the average quadratic error $<r^2>$ is larger of the limit value $B_0$, for example 5% of the square of the overall excursion of the signal to be recovered $E(t)$, the choice is made to give the useful recovered signal $X(t)$ the maximum (SUP) and minimum (INF) values of the analog signal E(t), which is a representation in the envelope mode.

On the contrary, if the average quadratic error $<r^2>$ is smaller than the limit value $B_0$, the test of the error function (A,B) is carried out. If the error function (A,B) is smaller than the couple of limit values $(B_1, B_2)$, that is to say if there are obtained simultaneously $A<B_1$ and $B<B_2$, the useful recovered signal X(t) are given the values of the calculated recovered signal X(t), which is a representation in the signal mode.

In the opposite case, that is to say if A or B is larger than its own limit value, the useful recovered signal X(t) are given the maximum (SUP) and minimum (INF) values of the analog signal E(t), which is a representation in the envelope mode.

Table 1 states the choices made per analysis period $\tau$ in the case of this non-limitative example, in which the average quadratic error function $<r^2>$ is combined with the error function (A, B).

TABLE 1

| $r^2 \geq B_0$ | | X(t) = (SUP, INF) |
|---|---|---|
| $r^2 < B_0$ | $A < B_1$ and $B < B_2$ | X(t) = S(t) |
| | $A > B_1$ or $B > B_2$ | X(t) = (SUP, INF) |

In a general sense, the signal mode is utilized when these two tests are successful. In the case in which they fail, the envelope mode is utilized.

Clearly, other criteria of choice can be used without leaving the scope of the invention.

At the end of these tests, the choice can be made to represent on a screen of an oscilloscope two tracks, one of which follows S(t) and INF and the other follows S(t) and SUP, the choice of the passage from the signal mode to the envelope mode being made automatically by the system. In the case of the signal mode, two superimposed tracks S(t) are obtained, while in the case of the envelope mode two separate tracks are obtained representing the values SUP and INF, i.e. for each analysis period $\tau$.

The values of the average quadratic error $<r^2>$ and/or of the error function (A,B), which have determined the automatic choice of the system, are also displayed so that the user can estimate the quality of recovery supplied by the oscilloscope.

FIG. 1 shows a block diagram of the arrangement for recovering the analog signal E(t).

The signal E(t) enters the analog processor 10, the outputs of which enter a memorization and digitization element 17, the outputs of which enter the calculation and test device 50, which supplies signals to the display and/or processing device 18. A multiplexer 15 supplies the time base, controlled by the calculation and test device 50, which supplies to the analog processor 10 signals for resetting to zero.

The memorization and digitization element 17 is constituted by an analog memory 20 operating at the same time base as the analog processor 10 and followed by an analog-to-digital converter 32 which, however, operates at a slower time base and which supplies information that is stored in a digital memory 22 (FIG. 1).

Dependent upon the execution speed required for the arrangement for recovering the signal, the analog memory 20 can be suppressed, the memorization and digitization element 17 then being constituted by the analog-to-digital converter 32 and by the digital memory 22 operating at the time base of the analog processor 10.

The display and/or processing member 18 is constituted by:

(a) a processing element 37 which exploits the informations relative to the useful recovered signal X(t) and to the error function signals;

(b) display means comprising a display device 70 receiving the signal originating from a first digital-to-analog converter 35 processing the same said informations and those originating from a second digital-to-analog converter 36 processing the synchronization signals at slow time base.

Figure 2:
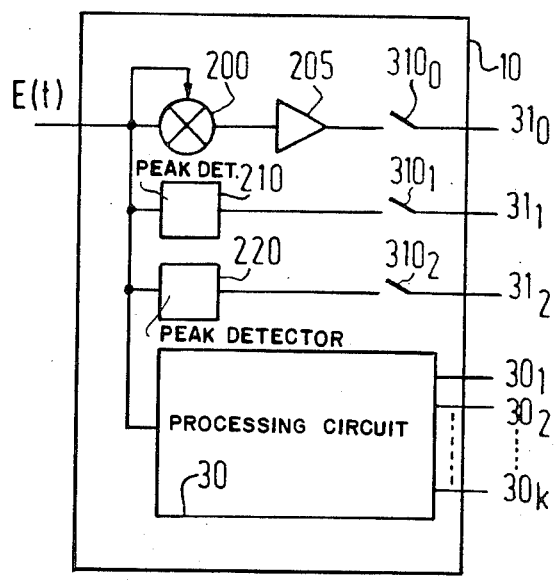
FIG. 2 shows the circuit diagram of the analog processor.

The analog processor 10 is shown in FIG. 2. The analogue signal E(t) enters a squaring element 200 which supplies the signal $E^2(t)$ which enters a signal integrator 205, the output of which enters a first sampling device $310_0$.

Further, the analog signal E(t) enters two peak detectors 210,220 which provide the maximum (signal SUP) and minimum (signal INF) values assumed by the analogue signal E(t) during the analysis period $\tau$, inclusive of the limit values. These signals SUP and INF enter a second and a third sampling device $310_1$ and $310_2$, respectively.

The analog signal E(t) also enters a processing circuit 30. The analog processor 10 supplies the output signals $31_0$ to $31_2$ $30_1$ to $30_k$ to memorization and digitization element 17.

Figure 3:
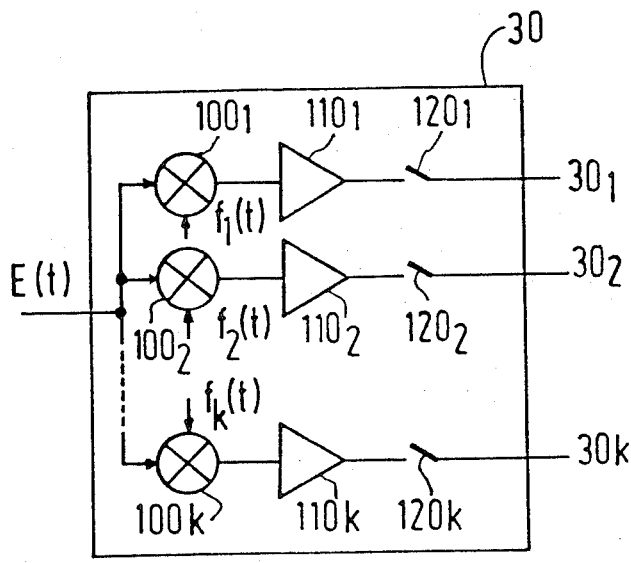
FIG. 3 shows the circuit diagram of the processing arrangement of the analog processor in its general concept.

According to the first variation, the processing circuit 30 (FIG. 3) is composed of k elementary circuits carrying out a similar processing operation for the k functions chosen. The first elementary circuit is constituted by the multiplier $100_1$, which receives at its input the analogue signal E(t) and the first chosen function $f_1(t)$. The output of the multiplier 100 is supplied to a first integration device $110_1$, whose output penetrates into a first sampler $120_1$. This elementary circuit is repeated k times to carry out a processing operation identical to the k functions chosen $\bar{f}_k(t)$. At the output of the processing circuit 30 there are available k signals $30_1$ to $30_k$.

In a particular embodiment, if signals should be approximated whose pass band extends over twice the Shannon frequency from a linear combination of polynomials, 4 polynomials having values 0, 1, 2, 3 have to be used for the functions $\bar{f}_k(t)$. Advantageously, in order to correspond more exactly to the signals to be processed according to the oscilloscopy, taking into account the criterion of choice described above, the functions $f_k(t)$ are chosen to be of the type $$\bar{f}_n(t) = n(1-t)^{n-1}.$$

Consequently, the four functions are:

$$f_1(t)=1; f_2(t)=2(1-t); f_3(t)=3(1-t)^2;$$
$$f_4(t)=4(1-t)^3.$$

By a suitable combination of these functions, the recovery of the curves of signals having linear, parabolic, sinusoidal or constant variations with time can be correctly approached so that useful signal forms can be recovered.

With another choice of the type of functions, complex forms can be recovered leading to the possibility of adapting the pass band of the recovered signal to the pass band of the input signal.

In the case in which functions are chosen of the type:

$$f_n(t) = n(1-t)^{n-1},$$

the generic term $<f_i \cdot f_j>$ of the line i and of the column J of the matrix (6) is wrtten as:

$$<f_i \cdot f_j> = \frac{ij}{i+j-1}$$

and in the chose case limited to 4 functions the matrix is written as:

$$M = \begin{vmatrix} 1 & 1 & 1 & 1 \\ 1 & 4/3 & 3/2 & 8/5 \\ 1 & 3/2 & 9/5 & 2 \\ 1 & 8/5 & 2 & 16/7 \end{vmatrix}$$

Otherwise, this choice offers the advantage that the determination of the average values $<E(t) \cdot \vec{f_k}(t)>$, according to the method of the invention, are derived from each other by recurrence, which permits a simple experimental realization.

Thus, after a conventional mathematic development, this choice permits of writing for each analysis period $\tau$:

$$<E(t) \cdot f_1(t)> = <E(t) \cdot 1> = -P_1(\tau)$$

$$<E(t) \cdot f_2(t)> = <E(t) \cdot 2(1-t)> = -P_2(\tau)$$

$$<E(t) \cdot f_3(t)> = <E(t) \cdot 3(1-t)^2> = -P_3(\tau)$$

$$<E(t) \cdot f_4(t)> = <E(t) \cdot 4(1-t)^3> = -P_4(\tau)$$

in which event the functions $P_n(t)$ are interconnected by the relation:

$$P_n(t) = -n \int_0^t P_{n-1}.$$

This indicates that the term $P_n(t)$ of the order n is defined by determining the average value of the preceding term $P_{n-1}$, which average value has to be multiplied by the order n of the term $P_n(t)$. In the arrangement according to the invention, these average values are calculated by means of series-connected integrators whose gains in absolute value are equal to their respective orders n.

Figure 4:
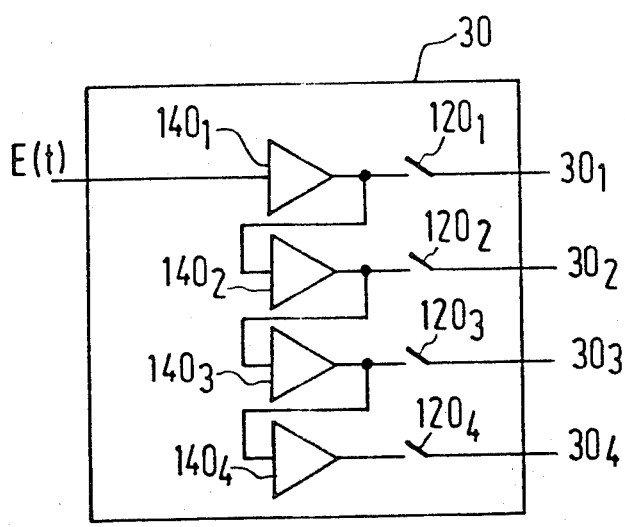
FIGS. 4, 5 and 6 show the circuit diagrams of the processing arrangements of the analog processor for particular choices of the recovery functions.

For each analysis period $\tau$, the determination of the values $P_1(\tau)$, $P_2(\tau)$, $P_3(\tau)$, $P_4(\tau)$ is obtained by means of the processing circuit 30 shown in FIG. 4. The four integrators $140_1$ to $140_4$ having gains of $-n$ are connected in series, the analog signal E(t) entering the first integrator $140_1$. The outputs of the four integrators corresponding to the four signals $P_1(\tau)$, $P_2(\tau)$, $P_3(\tau)$, $P_4(\tau)$ are individually connected to four samplers $120_1$ to $120_4$, the processing circuit 30 supplying four signals $30_1$ to $30_4$ to the memorization and digitization element 17.

On the other hand, the integration devices $110_1$ to $110_k$ or the integrators $140_1$ to $140_4$ are considered to be perfect integrators, that is to say for which the pulse response is practically rectangular. However, without departing from the scope of the invention, the method and the arrangement may use imperfect integrators, such as RC integrators. In this case, instead of the average value of the signal, there is obtained at the output of the integrator with, for example, $f_1(t)-1$;

$$\int_o^T E(t) \cdot e^{(-1+t)/\tau_1}$$

in which $\tau_1$ is the time constant of the R.C. integrator.

It stands to reason that the number and the type of the chosen functions do not limit the invention, the latter being chosen by those skilled in the art in accordance with the envisaged integration.

Figure 5:
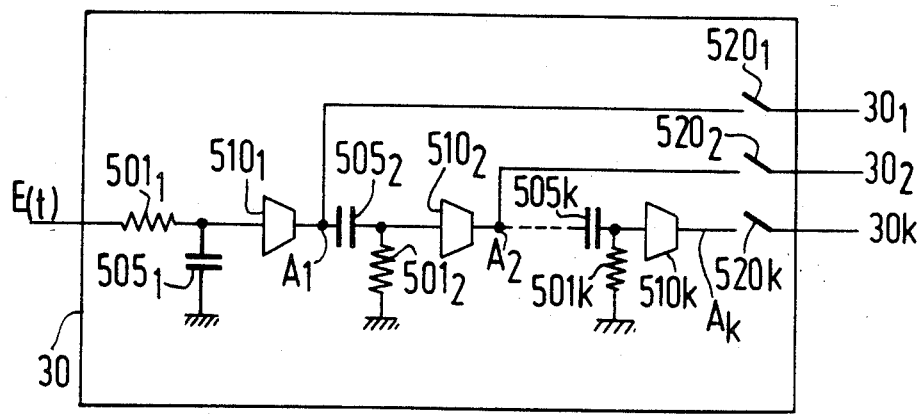

According to the second variation corresponding to the filters having a pulse response $\bar{h}_k(t)$ defined above on the basis of the equation (7), it is possible to obtain the processing circuit 30 in two different manners:

In a first manner (FIG. 5), use is made of a filter having a pulse response $\bar{h}_k(t)$ having an input receiving the analog signal E(t) formed by the series arrangement of elementary filtering stages defined in such a manner that, viewed from the outputs $A_1, A_2 \ldots A_k$, the filter has transmittances equal to $h_1(t), h_2(t), \ldots, h_k(t)$. The first stage comprises an integrator, the signal E(t) arriving at a resistor $501_1$, the other end of which is connected to ground through a capacitor $505_1$ and to an impedance adaptor $510_1$, which only serves to isolate the stages of the processing circuit from each other. The second stage comprises a differentiator, the output $A_1$ of the impedance adapter $510_1$ being connected to a capacitor $505_2$, the other end of which is connected to ground through a resistor $501_2$ and to an impedance adapter $510_2$ having an output $A_2$. The second stage is then repeated k times with an identical differentiator structure. The k outputs $A_1, A_2, \ldots, A_k$ are connected to k samplers $520_1, 520_2, \ldots, 520_k$ which supply k signals $30_1, 30_2, \ldots, 30_k$ at the output of the processing circuit 30.

Figure 6:
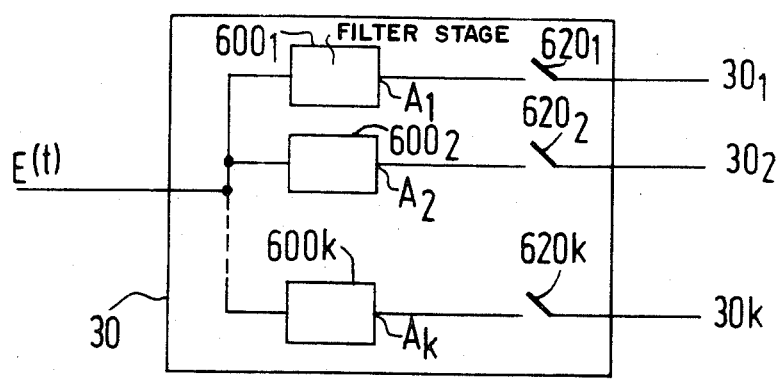

In a second manner (FIG. 6) of obtaining the same second variation, the k elementary filtering stages are arranged in parallel. The analog signal E(t) arrives at the input of the k elementary filtering stages ($600_1$ to $600_k$) having a pulse response $h_1(t), \ldots, h_k(t)$, whose k outputs are connected to k samplers $620_1$ to $620_k$, which supply k signals $30_1$ to $30_k$ to the output of the processing circuit 30. This second manner has the advantage that the k elementary filtering stages can be controlled independently.

It is clear that in the first manner (series arrangement) or in the second manner (parallel arrangement), the elementary filtering stages constituted by integrators or by differentiators or by special band-pass filters can follow each other in an order different from that just indicated without departing from the spirit of the invention.

The analog processor 10 carries out the acquisition of the information during the period T1 for each analysis period $\tau$. In the present case, in which the analog memory 20 is used (FIG. 1), the information y are stored in each analysis period $\tau$. They are then digitized and subsequently stored in the digital memory during the period T2. In the opposite case, the information originating from the processor 10 is directly digitized by the analog-to-digital converter 32 and is then stored in the digital memory 22, i.e. during the acquisition period T1.

At the end of this period, the stored informations are processed according to the equations (1) to (5) and then the results are tested in the calculation and test device 50 during the period T2. At the end of these operations, the useful data is then recovered at a slow time base and are displayed by the display device 70, while simultaneously the acquisition and processing operations are repeated relative to the periods T1 and T2.

The calculations and test device 50 supplies besides the synchronization and time base signals for the display, the useful recovered signal X(t) and/or the average quadratic error signal $<r^2>$ and/or the signal representing the error function (A, B). The values of the average quadratic error $<r^2>$ are compared with a limit value defined beforehand. If the signal has slightly varied, $<r^2>$ is smaller than the limit value and the error function (A, B) is subjected to the second test. If A and B are smaller than the respective limit values ($B_1$, $B_2$), the calculation and test device 50 automatically recovers the calculated recovered signal S(t), that is to say that the signal mode is concerned. If A and B are larger than their respective limit values ($B_1$, $B_2$), the calculation and test device 50 automatically recovers the values SUP and INF, that is to say that the envelope mode is concerned. If the signal has varied considerably, $<r^2>$ is larger than the limit value and the calculation and test device 50 automatically and simultaneously recovers the values SUP and INF determined, which corresponds to the envelope mode. In the two modes the arrangement displays the value of the average quadratic error $<r^2>$ calculated and/or the error function (A, B) thus giving an indication about the error made in the choice obtained, which allows a manual correction.

The analog memory 20 which stores the analog gue information is advantageously a charge transfer device.

What is claimed is:

1. An arrangement for obtaining a useful recovered signal X(t) for display and/or processing comprising: an analog processor, means for applying an analog signal E(t) to the analog processor, means coupling outputs of the analog processor to a memorization and digitization element, means coupling outputs of the memorization and digitization element to a calculation and test device, which supplies:
   (a) to a display device or a processing element followed by a display the useful recovered signal X(t) and signals of error function(s) for each analysis period $\tau$ as well as synchronization signals and time base signals; and
   (b) to the analog processor signals for resetting to zero and to a multiplexer synchronization signals, the multiplexer supplying the operating time base signals to the analog processor, to the memorization and digitization element and to the calculation and test device.

2. An arrangement for obtaining a useful recovered signal X(t) as claimed in claim 1, characterized in that the analog processor comprises:
   (a) a processing circuit for processing the analog signal E(t) by functions $\bar{f}_k(t)$;
   (b) and, a circuit for squaring the analog signal E(t) to provide an output to a signal integrator connected in cascade to a first sampling device;
   (c) and, two peak detectors responsive to the analog signal E(t) for determining the maximum and the minimum, respectively, of the analog signal E(t) during the analysis period $\tau$, inclusive of the limit values, the said detectors being coupled to a second and a third sampling device, respectively.

3. An arrangement for obtaining a useful recovered signal X(t) as claimed in claim 2, characterized in that the processing circuit comprises a series arrangement of k elementary filtering stages having outputs $A_1 \ldots A_k$ and having at said outputs transmittances $h_1(t) \ldots h_k(t)$, the outputs $A_1 \ldots A_k$ being connected respectively to k samplers which supply k output signals.

4. An arrangement for obtaining a useful recovered signal X(t) as claimed in claim 2, characterized in that the processing circuit comprises k multiplier circuits for multiplying the signal E(t) by the k functions $f_k(t)$, a plurality of k respective integration devices connected in cascade with k respective samplers, said samplers having k outputs connected to inputs of the memorization and digitization element.

5. An arrangement for obtaining a useful recovered signal X(t) as claimed in claim 2, characterized in that the processing circuit comprises k integrators connected in series, the first integrator having a gain $-1$ and the $k^{th}$ integrator having a gain $-k$, said integrators each being connected at its output to k respective samplers, the k outputs of the samples being connected to inputs of the memorization and digitization element.

6. An arrangement for obtaining a useful recovered signal X(t) as claimed in claim 5, characterized in that the variable k is equal to 4.

7. An arrangement for obtaining a useful recovered signal X(t) as claimed in claim 2, characterized in that the signal integrator comprises an RC circuit.

8. An arrangement for obtaining a useful recovered signal X(t) as claimed in claim 1, characterized in that the memorization and digitization element comprises an analog memory, an analog-to-digital converter and a digital memory connected in cascade.

9. An arrangement for obtaining a useful recovered signal X(t) as claimed in claim 1, characterized in that the memorization and digitization element comprises an analog-to-digital converter and a digital memory connected.

10. An arrangement for obtaining a useful recovered signal X(t) as claimed in claim 8, characterized in that the analog memory is a charge transfer device.

11. An arrangement as claimed in claim 4 wherein the integration devices comprise RC circuits.

12. An arrangement as claimed in claim 5 wherein the integrators comprise RC circuits.

13. A device for displaying a useful recovered signal X(t) recovered from an analog signal E(t), with means for forming X(t) per analysis period $\tau$ either from samples of a calculated recovered signal S(t) represented in a signal display mode or from minimum and maximum values of the analog signal E(t) represented in an envelope display mode, wherein said device comprises, an analog processor having means provided with k user-chosen functions $f_k(t)$, preferably in the form of polynomials, whereby the analog processor comprises means for forming k products $E(t)f_k(t)$ and means for forming averages $<E(t)f_k(t)>$ thereof in the period $\tau$ and means for forming averages $<E^2(t)>$ of the square of E(t), and peak detector means for forming max(SUP) and min(INF) values of E(t), means for sampling said average and said max(SUP) and min(INF) values, an analog memory for storing for every analysis period $\tau$, fitting n times in a period $T_1$, said sampled values, an analog-to-digital-converter for digitizing in a subsequent period $T_2$ the values stored in the analog memory in period $T_1$ and a digital memory to store the digitized values, a calculation and test device provided with programming means for calculating the recovered signal S(t) from said digitized values, said programming means comprising a first algorithm for inverting a matrix M stored as an array of data in storage means, which matrix M represents calculated values from said user functions, the structure of M being known from a least-squares minimalization procedure, a second algorithm for calculating k coefficients $\tilde{S}_k$ by multiplying the inverse matrix $M^{-1}$ with said k averages $<E(t)\vec{f}_k(t)>$, a third algorithm for calculating the recovered signal S(t) by multiplying the k coefficients $\tilde{S}_k$ with said k functions $f_k(t)$, said calculation and test device further comprising decision programming means provided with decision criteria for forming the useful recovered signal(s) X(t) either from S(t) or from said digitized max(SUP) and min(INF) values, and further comprising digital-to-analog converter(s) for reconstructing X(t) to analog signal(s) and a display for displaying the signal(s).

14. An arrangement for obtaining a useful recovered signal X(t) as claimed in claim 2 wherein the processing circuit comprises a parallel arrangement of k elementary filtering stages having outputs $A_1 \ldots A_k$ and having at said outputs transmittances $h_1(t) \ldots h_k(t)$, the outputs $A_1 \ldots A_k$ being connected respectively to k samplers which supply k output signals.

15. A device as claimed in claim 13, wherein the means for forming k averages $<E(t)\vec{f}_k(t)>$ comprise k multiplier circuits for multiplying E(t) with $f_k(t)$ and k integrator circuits for averaging connected in cascade with respective ones of the multiplier circuits.

16. A device as claimed in claim 13, wherein the means for forming k averages $<E(t)\vec{f}_k(t)>$ comprise a series arrangement of filter devices having respective outputs that yield respective said k averages.

17. A device as claimed in claim 13, wherein the means for forming k averages $<E(t)f_k(t)>$ comprises a parallel arrangement of filter devices having respective outputs that yield respective said k averages.

18. A device as claimed in claim 17, wherein the filter devices are dimensioned in relation to the k user-chosen functions $\vec{f}_k(t)$ said k averages in consecutive analysis periods $\tau$ without the outputs having to be reset after every analysis period $\tau$.

19. A device as claimed in claim 13, wherein for the choice of user-chosen functions $f_k(t)$ of the type $\vec{f}_\eta(\tau) = \eta(1-t)^{n-1}$ the means for forming said k averages $<E(t)f_k(t)>$ comprise a series arrangement of integrator circuits with gain $-n$ having respective outputs where said k averages become available.

20. A device as claimed in claim 13 wherein the decision criteria of the decision programming means comprise at least one error function from the calculated recovered signal S(t) and the analog signal E(t) in the analysis period $\tau$.

21. A device as claimed in claim 20 wherein the error function determined by the decision programming means is an average quadratic error function $<r^2> = <\{E(t)-S(t)\}^2>$, wherein $r^2$ is the quadratic error function.

22. A device as claimed in claim 20, wherein the error function determined by the decision programming means is a two-valued error function (A,B) of the two respective values A and B, wherein A is the absolute value of {SUP—SUP(S(t))} and B is the absolute value of {INF—INF(S(t))}, wherein SUP(S(t)) is the maximum and INF(S(t)) is the minimum values of S(t) in the analysis period T and wherein SUP and INF are sampled maximum respective minimum signal values of E(t) in the analysis period $\tau$.

23. A device as claimed in claim 20, wherein the decision programming means comprise means for testing the error functions against predetermined limit values in order to decide for respective envelope or signal mode.

24. A device as claimed in claim 23, wherein the error functions are the average quadratic error function and the error function (A,B) whereby the decision programming means comprise means for selecting the envelope mode if the average quadratic error function yields a value below a predetermined level $B_o$ and further comprise means for selecting the envelope mode if the average quadratic error function yields a value above the predetermined value $B_o$ and the error function (A,B) tested against limit values ($B_1$, $B_2$) yields values outside the limit values ($B_1$, $B_2$) and whereby the decision programming means comprise means for selecting the signal mode for alternative values of the quadratic error function and the error function (A,B) in the analysis period $\tau$.

25. A device as claimed in claim 24, wherein displayed signals on the display comprise the reconstructed X(t) on the basis of an automatic choice based on the decision criteria.

26. A device as claimed in claim 23, wherein the displayed signals on the display comprise the error function and the limit values on the basis wherein a manual choice is made for displaying in the respective envelope and signal display mode the useful recovered signal X(t).

27. A digital oscilloscope comprising a device as claimed in claim 13.

* * * * *